United States Patent [19]
Wei

[11] Patent Number: 4,941,154
[45] Date of Patent: Jul. 10, 1990

[54] TRELLIS CODING METHOD AND ARRANGEMENT FOR FRACTIONAL BIT RATES

[75] Inventor: Lee-Fang Wei, Lincroft, N.J.

[73] Assignee: AT&T Bell Laboratories, Murray Hill, N.J.

[21] Appl. No.: 358,221

[22] Filed: May 30, 1989

[51] Int. Cl.$^5$ ............................................. H04R 14/02
[52] U.S. Cl. ......................................... 375/39; 371/43
[58] Field of Search ...................... 455/60; 375/17, 25, 375/39, 27; 370/19, 20; 371/43, 44, 45; 332/103, 104

[56] References Cited

U.S. PATENT DOCUMENTS

3,925,611  12/1975  Dennis ................................. 375/39
4,483,012  11/1984  Wei ..................................... 375/39
4,660,214  4/1987   Pahlavan et al. ...................... 375/39

Primary Examiner—Benedict V. Safourek
Attorney, Agent, or Firm—Ronald D. Slusky

[57] ABSTRACT

A signal coding technique for use with fractional bit rates is disclosed which, for a given dimensionality, allows the use of smaller constellations, and thus provides greater robustness in the presence of various impairments, than would otherwise be the case yet entails essentially no decoding delay penalty. In this technique, one or more of the input bits are trellis encoded and the trellis-encoded bits identify one of a predetermined plurality of subsets of the signal constellation and the particular symbols selected for transmission from two or more identified subsets are chosen by the non-trellis-encoded bits interdependently.

36 Claims, 9 Drawing Sheets

| LEADS 131 | | | | | | | | | LEADS 142 | | LEADS 143 | | LEADS 144 | | LEADS 145 | | INNER/OUTER PATTERN | | |
|---|---|---|---|---|---|---|---|---|---|---|---|---|---|---|---|---|---|---|---|
| $\emptyset$ | $X_1$ | $X_2$ | $X_3$ | $X_4$ | $X_5$ | $X_6$ | $X_7$ | $X_8$ | $\emptyset$ | $X_1$ | $X_2$ | $\emptyset$ | $X_3$ | $X_4$ | $\emptyset$ | $X_5$ | $X_6$ | $\emptyset$ | $X_7$ | $X_8$ | 1 | 1 | 1 | 1 | 1 | 1 |
| 1 | $\emptyset$ | $X_3$ | $X_4$ | $X_5$ | $X_6$ | $X_7$ | $X_8$ | 1 | $\emptyset$ | $\emptyset$ | $\emptyset$ | $X_3$ | $X_4$ | $\emptyset$ | $X_5$ | $X_6$ | $\emptyset$ | $X_7$ | $X_8$ | 0 | 1 | 1 | 0 | 1 | 1 |
| 1 | $\emptyset$ | 1 | $X_3$ | $X_4$ | $X_5$ | $X_6$ | $X_7$ | $X_8$ | $\emptyset$ | $X_3$ | $X_4$ | 1 | $\emptyset$ | $\emptyset$ | $\emptyset$ | $X_5$ | $X_6$ | $\emptyset$ | $X_7$ | $X_8$ | 1 | 0 | 1 | 1 | 0 | 1 |
| 1 | 1 | 1 | $X_3$ | $X_4$ | $X_5$ | $X_6$ | $X_7$ | $X_8$ | $\emptyset$ | $X_3$ | $X_4$ | $\emptyset$ | $X_5$ | $X_6$ | $\emptyset$ | $\emptyset$ | $\emptyset$ | $\emptyset$ | $X_7$ | $X_8$ | 1 | 1 | 0 | 1 | 1 | 0 |
| 1 | 1 | 1 | $X_3$ | $X_4$ | $X_5$ | $X_6$ | $X_7$ | $X_8$ | $\emptyset$ | $X_3$ | $X_4$ | $\emptyset$ | $X_5$ | $X_6$ | $\emptyset$ | $X_7$ | $X_8$ | 1 | $\emptyset$ | $\emptyset$ | 1 | 1 | 1 | 1 | 1 | 0 |

| LEAD 331 | LEAD 342 | LEAD 343 | INNER/OUTER PATTERN |
|---|---|---|---|
| $\emptyset$ $X_1$ $X_2$ | $\emptyset$ $X_1$ | $\emptyset$ $X_2$ | I  I |
| 1 $\emptyset$ $X_2$ | 1 $\emptyset$ | $\emptyset$ $X_2$ | O  I |
| 1  1 $X_2$ | $\emptyset$ $X_2$ | 1 $\emptyset$ | I  O |

TRELLIS CODING METHOD AND ARRANGEMENT FOR FRACTIONAL BIT RATES

BACKGROUND OF THE INVENTION

The present invention relates to signal coding.

During the past decade, coded modulation has proven to be a practical, power-efficient and bandwidth-efficient modulation technique for channels with additive white Gaussian noise (AWGN). Such techniques have now been widely used in commercial telephone voiceband modems and have resulted in an increase in the commercially achievable line rates of those modems up to 19.2K bits/s.

Coded modulation techniques are often used in conjunction with 2N-dimensional signal constellations, $N \geq 1$. For cases of $N>1$, in particular, a 2N-dimensional signal constellation can be formed by concatenating N/M constituent 2M-dimensional constellations. Usually, $M=1$ so that N constituent two-dimensional (2 D) constellations are used. The concatenation of the constituent 2 D constellations is usually performed in the time domain, although it can also be done in the frequency, polarization or space domains or combinations thereof.

Within the context of coded modulation techniques, an engineering tradeoff is required in terms of the dimensionality of the constellation used. On the one hand, using higher-dimensional constellations reduces the required size of the constituent 2 D constellations. This is advantageous in that the signalling will be more robust in the presence of impairments other than AWGN, such as non-linear distortions, residual intersymbol interference and phase jitter, as is the case in telephone voiceband modems. Disadvantageously, on the other hand, the decoding delay in the receiver increases almost linearly with 2N, i.e., with the dimensionality of the constellation.

The issues may be even more complex. For example, making maximum use of the available bandwidth in a bandwidth-limited environment, such as telephone voiceband transmission, may dictate use of a particular baud rate. For example, in telephone voiceband applications a baud rate of 2,742.86 $(=19,200 \div 7)$ is typical. At the same time, however, most present-day data transmission is carried out at a selected one of a limited set of standard bit rates, e.g., 14.4K bits/s. Given a particular dimensionality, say, 2N, of the selected constellation, the selected baud and bit rates may result in a fractional number of information bits per 2N-dimensional symbol (hereinafter "fractional bit rate"). For example, use of a 2 D constellation with the above baud and bit rates results in a fractional bit rate of $14,400/2,742.86 = 5.25$ bits per 2 D symbol. Even when the rate desired to be used in a given application does not result in a fractional bit rate, such may result when, for example, a fallback bit rate is used in conjunction with the selected baud rate. A fallback bit rate is desirable for continuous operation of transmission equipment when the channel condition deteriorates.

To this point, the prior art has favored the use of a constellation of sufficient dimensionality that a fractional bit rate does not occur. Thus, in the example above, the fractional bit rate of 5.25 occurring with a 2 D constellation is avoided by using a 8D constellation with a bit rate of 21 bits per 8 D symbol. The reason for this is that achieving a fractional bit rate with, say, a 2 D constellation may necessitate the use of two or more different size 2 D constellations, one of which will, disadvantageously, always be larger than the constituent 2 D constellations of a higher-dimensional scheme at the same bit rate. Thus, continuing with the above example, a fractional bit rate of 5.25 would be achieved in a conventional 2 D trellis coding scheme—which adds a single redundant bit per 2 D symbol—by transmitting 6, 6, 6 and 7 bits periodically in successive four symbol intervals using $2^6=64$- and $2^7=128$-symbol constellations. The average bit rate, then, is, of course, the average of 6, 6, 6 and 7, or 6.25, as desired. Alternatively, an 8 D trellis coding scheme can be used in which $4 \times 5.25 = 21$ data bits are communicated for each 8 D symbol along with a single redundant bit to provide an encoded bit rate of 22 bits per 8 D symbol. The 8 D constellation would then have $2^{22}$ 8 D symbols, which can be represented by concatenating a sequence of four 48-signal-point constituent 2 D constellations. Thus the 8D scheme, because it uses the 48-point 2 D constellation exclusively—as contrasted to the combination of 64-symbol and 128-symbol constellations—provides somewhat better performance, for the reasons discussed hereinabove. Disadvantageously, however, the decoding delay for the 8 D trellis code may be significantly greater than that of the first-mentioned, 2 D trellis-encoding scheme.

SUMMARY OF THE INVENTION

The present invention is directed to a technique for use with fractional bit rates which, for a given dimensionality, allows the use of smaller constituent 2 D constellations, and thus provides greater robustness in the presence of various impairments, than would otherwise be the case yet entails essentially no decoding delay penalty. In this technique, one or more of the input bits are trellis encoded and the trellis-encoded bits identify one of a predetermined plurality of subsets of the signal constellation—just as in the prior art. In accordance with the invention, however, the particular symbols selected for transmission from two or more identified subsets are chosen by the non-trellis-encoded bits interdependently. That is, two or more groups of non-trellis-encoded bits that would otherwise be used to independently choose symbols from respective identified subsets are, instead, used as a single group to choose all the symbols of those subsets.

BRIEF DESCRIPTION OF THE DRAWING

In the drawing,

FIG. 8 is a third embodiment of a transmitter utilizing a coding scheme embodying the principles of the invention;

DETAILED DESCRIPTION

The present invention is directed to a technique for use with fractional bit rates which, for a given dimensionality—and thus a particular decoding delay—allows the use of smaller constituent 2D constellations, and thus greater robustness, than would otherwise be the case. In this technique, one or more of the input bits are trellis encoded and the trellis-encoded bits identify one of a predetermined plurality of subsets of the signal constellation—just as in the prior art. In accordance with the invention, however, the particular symbols selected for transmission from two or more identified subsets are chosen by the non-trellis-encoded bits interdependently. That is, two or more groups of non-trellis-encoded bits that would otherwise be used to independently choose symbols from respective identified subsets are, instead, used as a single group to choose all the symbols of those subsets.

Figure 1:
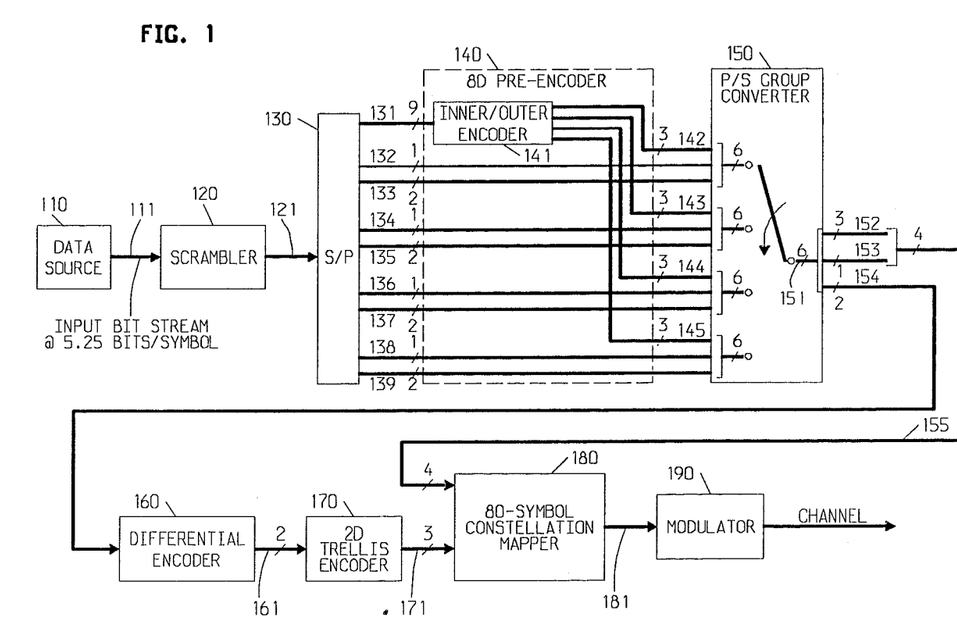
FIG. 1 is a block diagram of the transmitter portion of a telephone voiceband modem utilizing a coding scheme embodying the principles of the invention.
Figure 2:
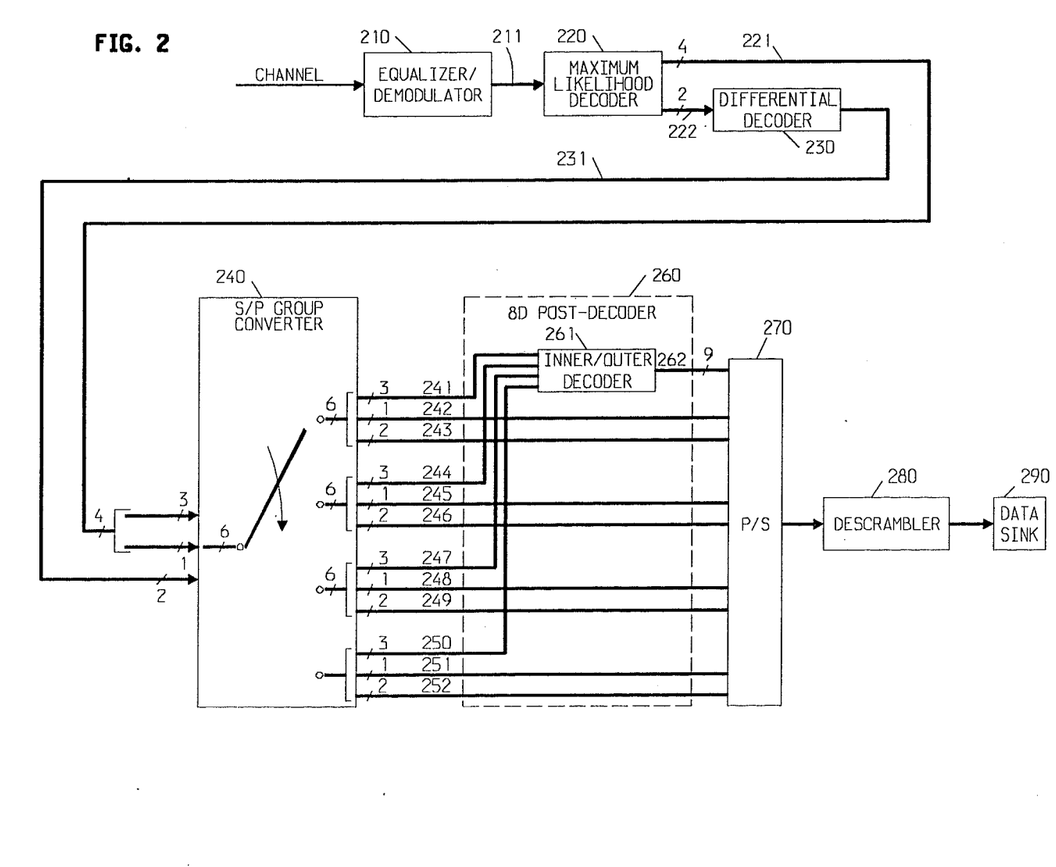
FIG. 2 is a block diagram of the receiver portion of the modem.

FIG. 1 is a block diagram of the transmitter portion of a telephone voiceband modem utilizing a coding scheme embodying the principles of the invention, as just described, while FIG. 2 is a block diagram of the receiver portion of the modem. Before proceeding with a discussion of FIGS. 1 and 2, however, reference is made to FIG. 3, which shows an 80-symbol, 2 D signal constellation used in the coding scheme. The 80 symbols are partitioned into eight 2 D subsets of ten symbols each. The eight 2 D subsets are denoted A through H, and the symbols in each 2 D subset are each marked in FIG. 3 with the lower-case version of their particular subset designation.

In accordance with conventional trellis-encoding practice, selected bits of an input data stream are processed by a trellis encoder to generate a set of trellis-encoded bits which define a sequence of the 2 D subsets from which successive symbols to be communicated are to be chosen. Thus, as shown by way of example in FIG. 4, the trellis coder output might identify as the first four subsets of the sequence—denoted by subset sequence identifiers S1, S2, S3 and S4—the subsets A, B, D and A, respectively. The remaining, non-trellis-encoded bits are then used to select a particular symbol from each identified 2 D subset.

Figure 4:
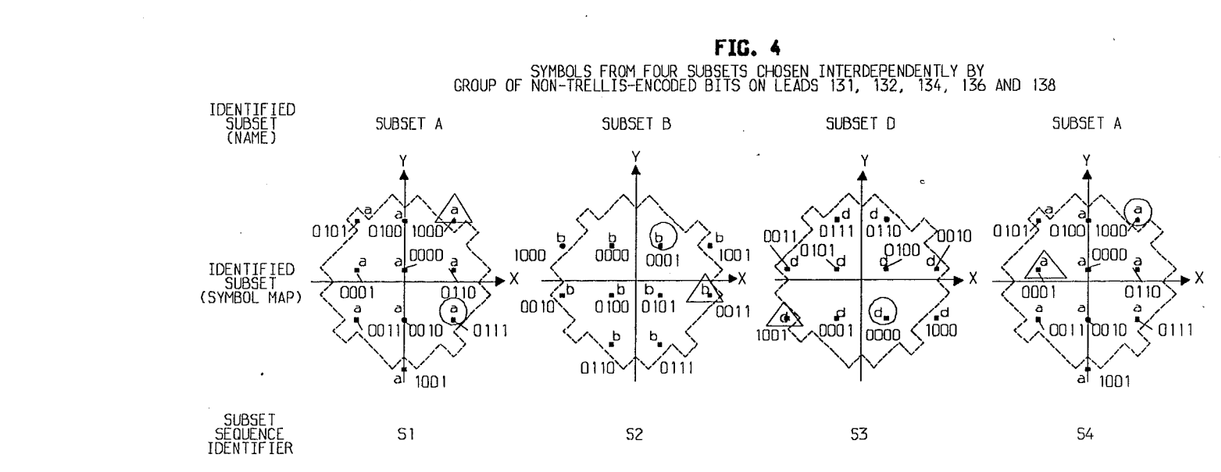
FIG. 4 shows a sequence of subsets of the constellation identified by the trellis encoder within the transmitter portion.

In the prior art, a particular group of non-trellis-encoded bits is used to select a particular one symbol from a particular one identified subset. In accordance with the invention, however, a particular group of non-trellis-encoded bits is used to identify a plurality of symbols from a particular plurality of identified subsets interdependently. Thus as indicated in FIG. 4, the symbols from subsets identified by subset sequence identifiers S1, S2, S3 and S4 are chosen interdependently, or jointly, in response to a particular group of non-trellis-encoded bits, those bits appearing, as described more fully hereinbelow, on leads 131, 132, 134, 136 and 138 of FIG. 1. An illustrative sequence of four symbols thus chosen are identified in FIG. 4 by circles surrounding them.

Since there are ten symbols in each of the four 2 D subsets, $10^4 = 10,000$ sequences of four 2 D symbols can be identified for each sequence of four subsets in the identified sequence. In the illustrative embodiment, however, there are 13 non-trellis-encoded bits, as will be seen, so that only $2^{13} = 8,192$ of those sequences are needed. The 1,808 sequences that are not used are selected with a view toward keeping the average transmitted power low while keeping the bit-to-symbol mapping simple, both of which are desirable. Specifically, it can be seen in both FIGS. 3 and 4 that two symbols in each subset—lying outside of the dashed box and referred to herein as the "outer symbols"—have greater energy than, or at least the same energy as, any of the other eight symbols of that subset referred to herein as the "inner symbols". The sequences that are not used have at least two outer symbols. (Alternatively stated, the sequences that are used have at most one outer symbol.) As will be shown hereinbelow, this approach results in exactly 8,192 allowed sequences, as desired. Thus in FIG. 4, the sequence of four symbols identified with a triangle around each symbol, which has two outer symbols, is not used.

We are now in a position to consider the voiceband modem of FIGS. 1 and 2 to see how the foregoing may all be implemented, beginning with FIG. 1.

Specifically, a data source 110, which may be, for example, a computer, generates an input bit stream on lead 111 at a fractional bit rate of 5.25 bits/symbol. As is conventional, that bit stream is applied to scrambler 120, which generates a scrambled bit stream at that same rate. The scrambler output bit stream on lead 121 is applied to serial-to-parallel converter 130, which aggregates four symbols' worth of bits to provide 21 output bits in parallel on leads 131–139. Leads 131–139 extend to 8 D pre-encoder 140. (The significance of the adjective "8 D" as applied to pre-encoder 140 is the fact that it operates on bits associated with four 2 D symbol intervals.)

Figure 3:
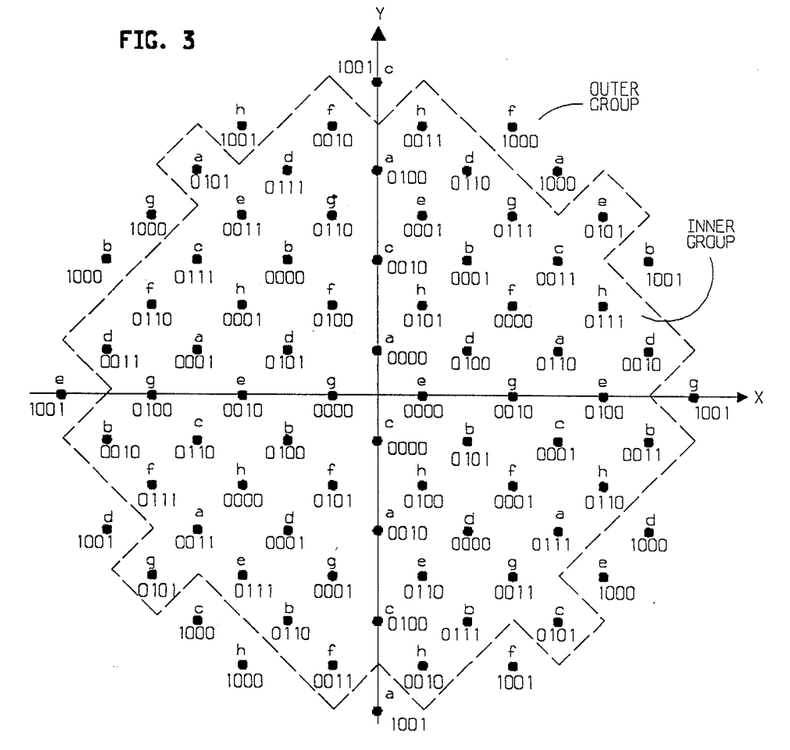
FIG. 3 shows a 2 D signal constellation illustratively used in the coding scheme.

Eight of the 21 bits, appearing on leads 133, 135, 137 and 139, are not actually processed by pre-encoder 140 but, rather, pass directly through it. As described hereinbelow, these bits will ultimately be trellis-encoded to identify a particular sequence of four 2 D subsets from which the transmitted symbols are chosen. The other thirteen, non-trellis-encoded bits, appearing on leads 131, 132, 134, 136 and 138 jointly identify, in accordance with the invention, a particular one symbol from each of the four identified 2 D subsets. Specifically, nine of the non-trellis-encoded bits, appearing on leads 131, are applied to inner/outer encoder 141 within pre-encoder 140. Encoder 141 is illustratively a simple logic/gate arrangement which provides on four sets of output leads 142, 143, 144 and 145 respective three-bit words with values as shown in the truth table of FIG. 5. The four-bit word comprised of (a) the three bits on lead 142 and (b) the one bit on lead 132 uniquely identifies a particular one symbol in each of the eight subsets A through H, as shown in FIG. 3. Thus, once a subset has been identified via the trellis-encoding process, the particular symbol from that subset to be transmitted is known.

At the same time, the four-bit word comprised of (a) the three bits on leads 143 and (b) the one bit on lead 134 also uniquely identifies a particular one symbol in each of the eight subsets A through H. Thus, once the second subset of the identified pair has been identified via the trellis-encoding process, the particular second symbol from that subset to be transmitted is also known. The third and fourth symbols are identified similarly.

Figure 5:
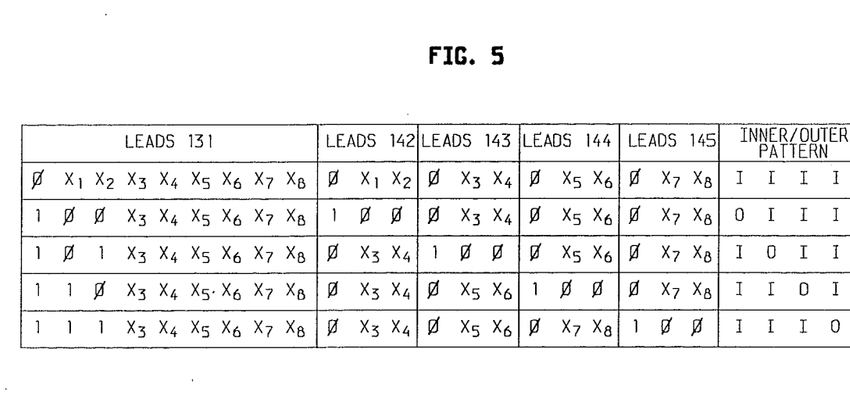
FIG. 5 is a truth table defining the operation of an inner/outer encoder within an 8 D precoder within the transmitter portion of FIG. 1.

The combination of (a) the four-bit-word-to-symbol assignment scheme shown in FIG. 3 and (b) the truth table of FIG. 5 is such as to ensure that the aforementioned 1,808 sequences of four symbols that contain more than one outer symbol are never chosen. More specifically, the table of FIG. 5 has five line entries, corresponding to different patterns of the bits on leads 131, with $X_i$, i=1, 2 ... 8 being binary variables that can assume the value of either "0" or "1". The first line entry corresponds to the case where the first of the nine bits on leads 131 is a "0" and the other eight bits are arbitrary. In this case, the sequence of four 2 D symbols will be comprised of four inner symbols. Note, in particular, from FIG. 3 that the bit pattern assigned to all inner symbols starts with "0". Accordingly, the three-bit patterns respectively provided on leads 142, 143, 144 and 145 all begin with "0". The other two bits of each such pattern are simply taken from a respective pair of bits from two of leads 131. The other four line entries correspond to the case where the first of the nine bits on leads 131 is a "1", the second and third bits take on each of the four possible binary patterns of "0" and "1", and the remaining six bits are, again, arbitrary. The four cases respectively correspond to sequences in which the first, second, third and fourth symbol is an outer symbol, while the other three symbols are inner symbols.

It will be appreciated from the foregoing that the first line entry of FIG. 5 defines $8^4 = 4,096$ sequences, while each of the other line entries defines $2 \times 8^3 = 1,024$ sequences, for a total of 8,192 sequences, as desired. Note, in particular, that the four bits assigned to each outer symbol begin with "100" and, as can be verified from FIG. 5, the combination of "100" with another "100" on leads 142, 143, 144 and 145 never occurs.

In summary, then, it can be seen that the thirteen bits on leads 131, 132, 134, 136 and 138 do indeed jointly and interdependently identify, in accordance with the invention, a particular one symbol from each of the four successive identified 2 D subsets.

The remainder of the transmitter of FIG. 1 is straightforward. Assume, for example, that it is time to transmit a symbol from subset S1 of the sequence. Parallel-to-serial group converter 150 first applies to its output leads 151 the six bits on leads 142, 132 and 133. The bits on leads 133 appear on leads 154, from which they are passed to a conventional differential encoder 160 and thence to 2 D trellis encoder 170. The latter implements any desired 2 D trellis code—in this case a so-called rate ⅔ code—which generates three bits on leads 171 extending to 80-symbol constellation mapper 180. Each of the $2^3 = 8$ different possible combinations of those bits identifies to mapper 180 a particular one of the eight subsets A through H, as dictated by the trellis code design. In the case of the subset identified by subset sequence identifier S1, it is the subset A. At the same time, the four bits on leads 142 and 132 are passed directly to mapper 180 via converter 150 and leads 152 and 153, thereby identifying to mapper 180 the specific symbol to be transmitted from the subset A—in this case, the subset A symbol associated with the bit pattern "0111". Mapper 180 provides on its output leads 181 a pair of numbers specifying the so-called in-phase and quadrature-phase amplitudes of the identified symbol. These are applied to modulator 190 which, in conventional fashion, generates a passband telephone line signal representing that symbol and applies it to a telephone channel.

Thereafter, converter 150 applies to its output leads 151 the six bits on leads 143, 134 and 135, ultimately resulting, in a similar fashion, in the transmission of the subset B symbol associated with the bit pattern "0001". The subset D and subset A symbols are transmitted similarly. The process repeats for as long as data appears on lead 111.

The receiver of FIG. 2 receives from the channel a telephone line signal generated by a transmitter of the type shown in FIG. 1. The line signal is first applied to equalizer/demodulator circuitry 210 which, in conventional fashion, recovers a sequence of signal points which it provides to maximum likelihood decoder 220. Because of distortion and other channel anomalies that circuitry 210 is not able to fully compensate for, the sequence of signal points on leads 211 are somewhat displaced in 2 D signal space from the 2 D symbols that were transmitted. As its name implies, the function of maximum likelihood decoder 220 is to (a) determine after a certain amount of decoding delay—based on a knowledge of the trellis code used by trellis encoder 170—what the most likely sequence of transmitted symbols actually was and (b) to provide on leads 221 and 222 six-bit words corresponding to those symbols, i.e., corresponding to the bits on leads 152, 153 and 161 in the transmitter.

The remainder of the processing performed in the receiver of FIG. 2 is the inverse of processing performed in the transmitter. Thus, in particular, the two bits on leads 222 are differentially decoded by differential decoder 230. The differentially decoded bits on leads 231 are then applied to serial-to-parallel group decoder 240 along with the four bits on leads 221. Converter 240 takes each six-bit group in turn and provides the bits thereof in parallel on leads 241–252, from which they pass to 8 D post decoder 260. The latter, in particular, includes inner/outer decoder 261 which converts the 12-bit inputs on leads 241, 244, 247 and 250 to nine-bit outputs utilizing the inverse of the truth table of FIG. 5. (Due to channel distortion, for example, it is possible that the receiver decoding process may result in more than one "100" pattern appearing on leads 241, 244, 247 and 250, even though such a pattern was explicitly excluded in the transmitter. That is, a transmission error has occurred. In order to take account of this possibility, inner/outer decoder 261 includes additional entries which map the unallowed pattern into an arbitrary pattern that is, in fact, allowed.) The resulting 21 bits on leads 262, 242, 243, 245, 246, 248, 249, 251 and 252 are thereafter converted to serial form by parallel-to-serial converter 270, descrambled by descrambler 280 and applied to a data sink 290 which may be, for example, a computer terminal.

Figure 6:
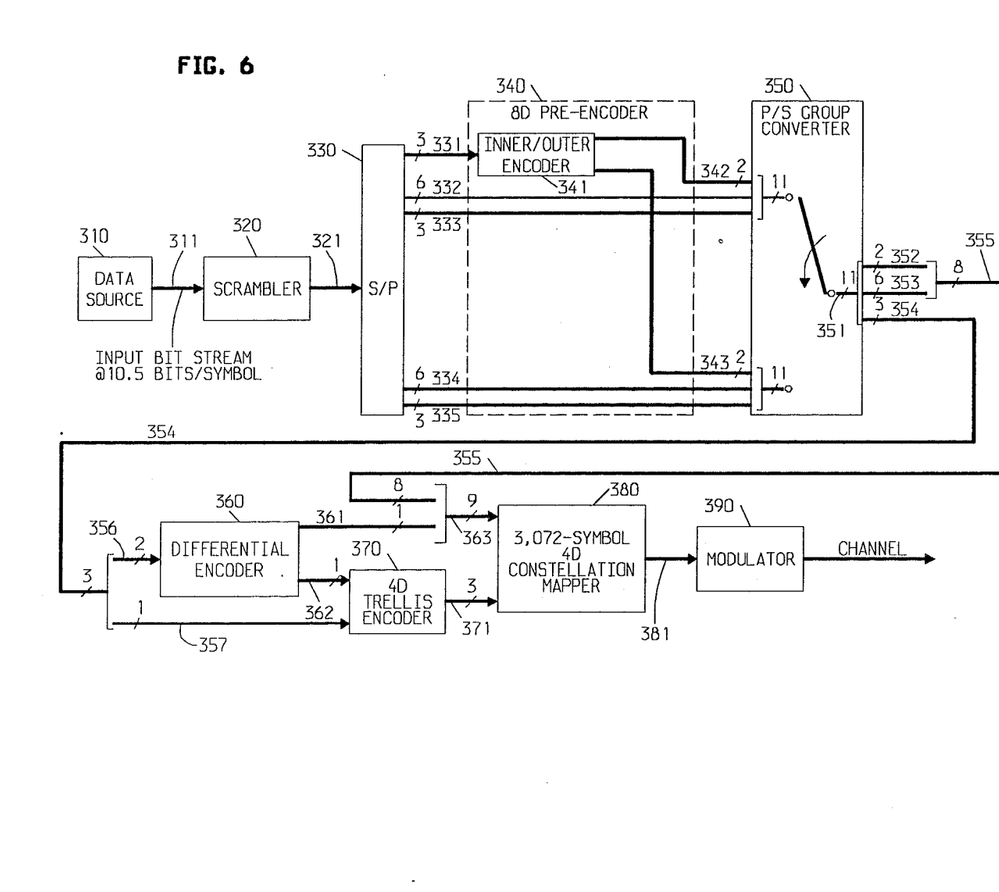
FIG. 6 is a second embodiment of a transmitter utilizing a coding scheme embodying the principles of the invention.

A second embodiment of a transmitter according to the invention is shown in FIG. 6. Here, again, data is transmitted at 14.4K bits/s at a baud rate of 2,742.86. In this case, however, the data is transmitted using a 4 D, rather then a 2 D, trellis code, yielding a fractional bit rate of 10.5 bits per 4 D symbol. Many of the circuit elements of the transmitter are the same as or similar to those in the embodiment of FIG. 1 and the reference numeral assignment scheme is the same except that the reference numerals in FIG. 6 begin with a "3" rather than a "1".

Further comparing the embodiments of FIGS. 1 and 6, the following differences may be noted:

Three bits at the output of converter 350—none of which were subjected to inner/outer encoding in 8 D pre-encoder 340 (as will be seen)—are applied to the combination of differential encoder 360 and trellis encoder 370. Specifically, the two bits on leads 356 are applied to differential encoder 360 and the one bit on lead 357 is applied directly to rate ⅔ trellis encoder 370. The other bit applied to trellis encoder 370 is one of the two output bits of differential encoder 360 appearing on lead 362. The other output bit of differential encoder 360, on lead 361, is combined with eight bits on leads 355 which form a group of nine non-trellis-encoded bits. The trellis code used in trellis encoder 370 is a 4 D code whose three output bits on leads 371 identify, to 3,072-symbol constellation mapper 380, one of eight 4 D subsets each comprised of 384 symbols. (For this embodiment, no particular 4 D constellation is shown in the FIGS. Indeed, it is difficult to graphically represent a 4 D constellation directly. However, an example of a 4 D coding scheme using constituent 2 D constellations is described hereinbelow in conjunction with FIGS. 8 and 9.) The nine non-trellis-encoded bits on leads 363 identify a particular 4 D symbol from the identified 4 D subset.

Another difference is that the 21 bits output by S/P converter 330 are processed in pre-encoder 340 in a different way than in FIG. 1. This difference arises as a result of the fact that the group of non-trellis-encoded bits are used to jointly identify symbols from only a pair of subsets identified by the trellis encoder, as compared with a sequence of four subsets in the FIG. 1 case. This results from the fact that the fractional portion of the bit rate is ¼ in the first case and ½ in the second.

Specifically, six of the 21 bits, appearing on leads 333 and 335, are not actually processed by pre-encoder 340 but, rather, pass directly through it onto lead 354 to be differentially encoded and/or trellis encoded, as described above. The other 15 bits, together with two differential encoder output bits on lead 361 (appearing in two successive 4 D symbol intervals), jointly identify, in accordance with the invention, a particular one symbol from each of the two successively identified 4 D subsets. Thus $2^{17}$ pairs of 4 D symbols are required for each pair of 4 D subsets.

More specifically to this end, each 384-symbol 4 D subset is illustratively divided into an inner group of 256 symbols and an outer group of 128 symbols, following the same philosophy as was applied to the first-described embodiment so that each inner symbol has less energy than, or at least the same energy as, each outer symbol. This results in a 3,072-symbol 4 D constellation having (256×8=) 2,048 inner symbols and (128×8=) 1,024 outer symbols. Specifically, three of the non-trellis-encoded bits, appearing on leads 331, are applied to inner/outer encoder 341 within pre-encoder 340. Encoder 341 is illustratively a small look-up table which provides on leads 342 and 343 respective two-bit words with values as shown in the truth table of FIG. 7. The nine-bit word comprised of (a) the two bits on leads 342, (b) the six bits on lead 332, (c) and one bit on lead 361 for each of the two 4 D symbol intervals uniquely identifies a particular one symbol in each of the aforementioned eight 4 D subsets. Thus, once a subset has been identified via the trellis-encoding process, the particular symbol from that subset to be transmitted is known. The second 4 D symbol is selected similarly.

Figure 7:
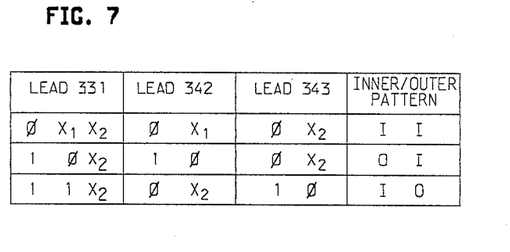
FIG. 7 is a truth table defining the operation of an inner/outer encoder within an 8 D precoder within the transmitter of FIG. 6.

As with FIG. 5, the truth table of FIG. 7 is arranged with a view toward keeping the average transmitted power low while keeping the bit-to-symbol mapping simple. To this end, the table of FIG. 7 has three line entries, corresponding to different patterns of the bits on leads 331. The first line entry corresponds to the case where the first of the three bits on leads 331 is a "0" and the other two bits are arbitrary. A bit assignment scheme in which inner symbols begin with "0" and outer symbols begin with "10" may be assumed. Accordingly, for this first line entry, the pair of 4 D symbols will be comprised of two inner symbols. The other two line entries correspond to the case where the first of the three bits on leads 331 is a "1", the second bit takes on one of the two possible bit values "0" and "1", and the third bit is, again, arbitrary. The two cases respectively correspond to pairs of 4 D symbols in which one symbol is an outer symbol and the other symbol is an inner symbol. It will thus be seen that the symbols that are selected are from only selected combinations of the inner and outer groups, with the combinations being selected, at least in part, on the basis of the average energy of the sequences of symbols in each combination.

It will be appreciated from the foregoing that the first line entry of FIG. 7 defines 256×256 (=$2^{16}$) pairs of 4 D symbols, while each of the other line entries defines 128×256 (=$2^{15}$) pairs of 4 D symbols, for a total of $2^{17}$ pairs of 4 D symbols, as desired.

A receiver for processing signals from a transmitter such as the transmitter of FIG. 6 (and FIG. 8 to be described) will be of the same general type as that shown in FIG. 2.

Theoretically, it is always possible to deal with 2N-dimensional codes using a 2N-dimensional constellation mapper, as is the case for the embodiment of FIG. 6. From a practical standpoint, however, present technology limits use of the 2N-dimensional mapper to situations in which the number of symbols in the constellation is reasonably small, such as may be the case with, for example, a 4-dimensional 8-PSK constellation, which is formed by concatenating a pair of constituent 2 D 8-PSK constellations, and which has, at most, 64 4 D symbols. For larger constellations, it is preferable to convert the 2N-dimensional constellation mapping to a sequence of N/M successive constituent 2M-dimensional constellation mappings. With such an approach, the constituent 2M-dimensional constellations have a much smaller number of points than the original 2N-dimensional constellation, thereby making the implementation tractable. Thus the 3,072-symbol 4 D constellation mapping used in the embodiment of FIG. 6 can b converted into a pair of successive constituent 2 D constellation mappings, wherein each constituent 2 D constellation has only 60 signal points, as will now be described with reference to the embodiment of FIG. 8. (The term "signal point"—or more simply "point-"—rather than the term "symbol" is used to denote the elements of the constituent constellations since those elements are not complete symbols. That is, they have meaning only in combination with at least one other point. The term "signal point" is, however, generic, so that a "symbol" can properly be also referred to as a signal point.)

In the third transmitter embodiment, shown in FIG. 8, the reference numeral scheme of the prior two embodiments is, again, carried forward except that the reference numerals now begin with a "4". As in the embodiment of FIG. 6, data is transmitted at 14.4K bits/s at a baud rate of 2,742.86 and using a 4 D trellis code to yield a fractional bit rate of 10.5 bits per 4 D symbol.

Figure 9:
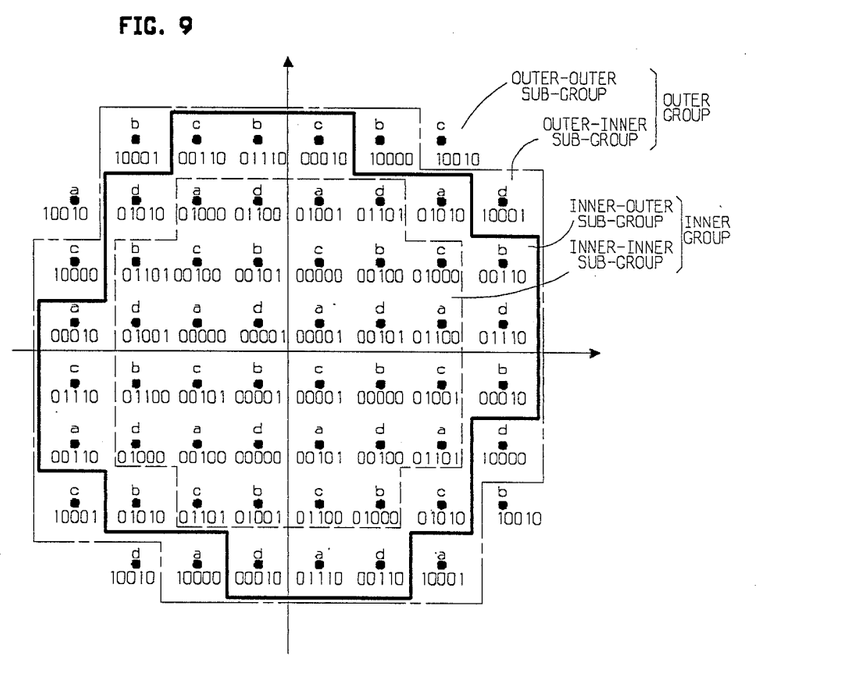
FIG. 9 shows an illustrative 60-point constituent 2 D constellation used in the coding scheme employed by the transmitter of FIG. 8.

Before proceeding with a further description of FIG. 8, reference is made to FIG. 9, which shows an illustrative 60-point constituent 2 D constellation for this case. The 60 points are partitioned into four 2 D subsets of 15 points each. The four 2 D subsets are denoted A through D, and the points in each 2 D subset are each marked in FIG. 9 with the lower-case version of their particular subset designation.

A 4 D constellation with $(60 \times 60=)$ 3,600 4 D symbols can be formed by concatenating a pair of such 60-point constituent 2 D constellations. However, as before, only 3,072 4 D symbols are needed. Eliminating the $(3,600-3,072=)$ 528 highest-energy 4 D symbols would, however, entail significant implementational complexity in the constellation mapper. Accordingly, a compromise is effected wherein, in order to achieve relative implementational simplicity, certain 4 D symbols in the constellation will have greater energy than certain symbols that are excluded.

The scheme for identifying the 3,072 4 D symbols that comprise the constellation is achieved as follows: The points in each subset in FIG. 9 are divided into an inner group and an outer group, the former having twelve points, which lie within the heavy, solid box, and the latter having three points, which lie outside of that box. Within each subset (and indeed—as it turns out in this case—throughout the entire 2 D constellation), each inner point has less energy than, or at most the same energy as, each outer point. We now define a "4 D inner symbol" of the 4 D constellation as a 4 D symbol comprised of a concatenation of two of the 2 D inner points from the constituent constellation of FIG. 9. There are $(12 \times 4)^2 = 48^2 = 2,304$ such symbols since each of the four 2 D subsets has twelve inner points. We similarly define a "4 D outer symbol" of the 4 D constellation as a 4 D symbol comprised of a concatenation of one 2 D inner point and one 2 D outer point (in either order). There are $(48 \times 12)+(12 \times 48)=1,152$ such symbols, since each of the four 2 D subsets has three 2 D outer points. (Note that certain of the 4 D inner points have greater energy than certain of the 4 D outer points, a situation that is tolerated in the interest of implementational simplicity.) There are thus a total of 3,456 possible symbols, thus leaving another $(3,456-3,072=)$ 384 symbols to be eliminated. Again, implementational considerations make it difficult to eliminate the highest-energy ones of these. Accordingly the embodiment of FIG. 8 employs a compromise which eliminates 256 4 D inner symbols and 128 4 D outer symbols for a total of 384, as desired.

Specifically, the 12-point inner group of each 2 D subset of the 60-point 2 D constituent constellation of FIG. 9 is further divided into two sub-groups of 8 and 4 points, respectively, herein referred to, and designated in FIG. 9, as the inner-inner and the inner-outer sub-groups. The points of the inner-inner sub-group all have less energy than the points of the inner-outer sub-group. Additionally, the 3-point outer group of each 2 D subset of the 60-point 2 D constituent constellation of FIG. 9 is further divided into two sub-groups of 2 and 1 points, respectively, herein referred to, and designated in FIG. 9, as the outer-inner and the outer-outer sub-groups. The points of the outer-inner sub-group all have energy no greater than the points of the outer-outer sub-group.

With the 2 D subsets thus subdivided, we are in a position to describe a convenient scheme for eliminating the aforementioned 256 4 D inner symbols and 128 4 D outer symbols. The 256 4 D inner symbols to be eliminated are those symbols formed by the concatenation of two points, each of which is taken from the 16-point inner-outer sub-group $(16 \times 16=256)$, since each of the four 2 D subsets has four inner-outer points. The 128 4 D outer symbols to be eliminated are those symbols formed by the concatenation of two points, one of which is taken from the 16-point inner-outer sub-group and the other of which is taken from the 4-point outer-outer sub-group $((16 \times 4)+(4 \times 16)=128)$, since each of the four 2 D subsets has one outer-outer point.

For the most part, the arrangement of the transmitter of FIG. 8 is self-explanatory in that it follows the basic layout of the two other embodiments already disclosed. Thus at this point we need only address specific key aspects of the embodiment.

In particular, inner/outer encoder 441 is illustratively identical to inner/outer encoder 141 of FIG. 1 and thus the truth table of FIG. 5 defines the operation of encoder 441, with leads 131 and 142–145 corresponding to leads 431 and 442–445, respectively. The assignment of bits to 2 D points in FIG. 9 is such that the first bit of the 5-bit pattern assigned to each of the 48 points of the inner group is "0" and the first three bits of the 5-bit pattern assigned to each of the twelve points of the outer group is "100". Based on the foregoing definitions of 4 D inner and outer symbols, the first line entry of FIG. 5 now corresponds to the case where both of the first and second 4 D symbols—to be identified by the non-trellis-encoded bits from a pair of 4 D subsets identified by the trellis encoder—are 4 D inner symbols (comprised of two points, each of which is from the inner 2 D group of the constellation of FIG. 9). The second and third line entries of FIG. 5 now correspond to the case where the first 4 D symbol is a 4 D outer symbol (comprised of one point from the outer 2 D group and one from the inner 2 D group) and the second 4 D symbol is a 4 D inner symbol (as defined above). In a similar way, the fourth and fifth line entries of FIG. 5 now correspond to the case where the first 4 D symbol is a 4 D inner symbol and the second 4 D symbol is a 4 D outer symbol.

As noted above, the division of the 2 D constituent constellations into inner and outer groups—as defined by encoder 441—leaves us with more symbols than we need. The further division into the aforementioned sub-groups, in order to arrive at precisely the desired number of symbols, is performed by inner/outer encoder 463. The latter is illustratively identical to inner/outer encoder 341 of FIG. 6 and thus the truth table of FIG. 7 defines the operation of encoder 463, with leads 331 and 342–343 corresponding to leads 454 and 472–473, respectively. In the context of the embodiment of FIG. 6, the table of FIG. 7 defines allowed patterns of inner and outer 4 D symbols. Now, however, the excluded pattern of "10" and "10" on leads 472–473 corresponds to the 4 D symbols where both the first and second 2 D points belong to either the inner-outer sub-group or the outer-outer sub-group. Note that all such 2 D points have "10" assigned to their fourth and fifth bits.

A further point to note is that, since each 2 D constituent constellation has four subsets, there are $(4 \times 4=)$ 16 possible pairs of such 2 D subsets and the eight 4 D subsets of the trellis code in question are formed such that each subset is comprised of two such pairs of 2 D subsets. The three bits on leads 471, as before, identify a particular one of the eight 4 D subsets and the one, non-trellis-encoded bit on lead 461 further identifies which of those two pairs of 2 D subsets in the identified 4 D subset is the one from which the symbol to be transmitted is to come. Implementationally, the bits on leads 461 and 471 are applied to 2 D-subset pair selector 480, which provides on its output leads 474 (475) a two-bit word identifying which of the four 2 D subsets is to be the first (second) subset of the pair.

The bits identifying the first and second 2 D points representing the first of the two 4 D symbols are applied in parallel to P/S group converter 476. The latter applies the bits representing the first of those 2 D points and then the second of those 2 D points to 2 D constellation mapper 482 which provides its output to modulator 490. The first and second 2 D points representing the second of the two 4 D symbols are processed similarly.

It will thus be seen that the pair of 4 D symbols that are selected are from only selected combinations of the various sub-groups of constituent 2 D constellations and, again, the combinations are selected, at least in part, on the basis of the average energy of the sequences of 2 D points in each combination.

A useful observation may be made at this point. On the one hand, the embodiment of FIG. 8 can be understood as involving the identification of a pair of 4 D subsets and interdependent selection of a pair of 4 D symbols from the identified 4 D subsets. On the other hand, however, this process can, alternatively, be understood as one involving the identification of a sequence of four 2 D subsets (even though a 4 D trellis encoder is used) from which four 2 D points are interdependently chosen. With this observation in mind, reference is now made to FIG. 10, which provides a broad conceptual view of a transmitter embodying the principles of the invention.

Figure 10:
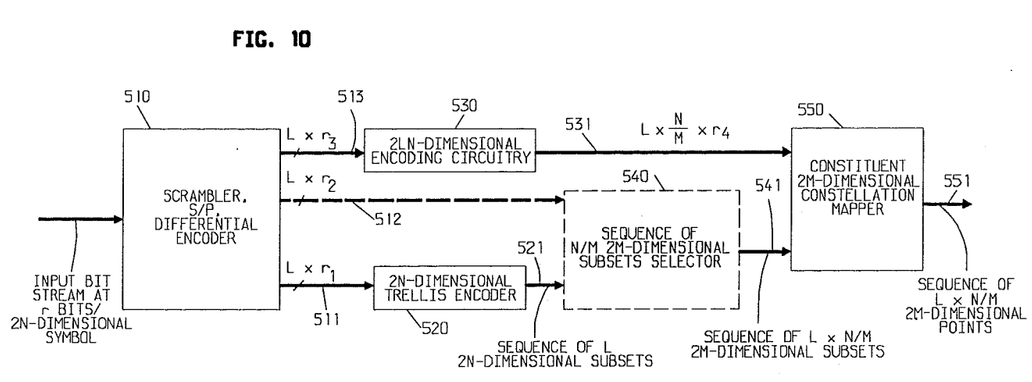
FIG. 10 shows a broad conceptual view of a transmitter embodying the principles of the invention.

In particular, the transmitter of FIG. 10 receives an input bit stream at a fractional bit rate of r bits per 2N-dimensional symbol. The functions of scrambling (all of the input bits), serial-to-parallel encoding and differential encoding (of some of the scrambled bits) is performed by circuitry 510. We define a parameter L as being an integer such that $L \times r$ is an integer. Preferably, L is the least such integer. Then, circuitry 510 provides on its output leads 511-513 $L \times r_3$ bits on leads 513, $L \times r_2$ bits on leads 512, and $L \times r_1$ bits on leads 511, where $r = r_1 + r_2 + r_3$ and $r_1$ and $r_2$ are integers. The bits on leads 511 are applied to 2N-dimensional trellis encoder 520, $r_1$ bits at a time, which identifies on its output leads 521 a sequence of L 2N-dimensional subsets. In the general case, each such subset consists of $2^{r_2}$ sequences of N/M 2M-dimensional subsets, each subset being a subset of the constituent 2M-dimensional constellations of the 2N-dimensional constellation. To this end, the information on leads 512 is applied to selector 540, $r_2$ bits at a time, which, in combination with the bits on leads 521, identifies to 2M-dimensional constituent constellation mapper 550, on its output leads 541, the desired sequence of $L \times N/M$ 2M-dimensional subsets. (As indicated by the elements shown by dashed lines, it may be noted that in the case where M=N (so that a 2N-dimensional mapper is used) or where each 2N-dimensional subset is comprised of only one sequence of N/M 2M-dimensional subsets, $r_2$ is zero and selector 540 is not needed.) At the same time, the bits on leads 513 are processed by 2LN-dimensional encoding circuitry 530, whose output on leads 531 defines to mapper 550, $r_4$ bits at a time, the particular sequence of $L \times N/M$ 2M-dimensional signal points to be taken from the identified $L \times N/M$ subsets. (In the particular embodiments previously disclosed, the heart of circuitry 530 comprises one or more inner/outer encoders.)

The three embodiments disclosed hereinabove can perhaps most easily be related to the generalized embodiment of FIG. 10 by simply considering the values of the first eight parameters set forth in Table I for each of those three embodiments.

TABLE I

| Embodiment Figure | r | $r_1$ | $r_2$ | $r_3$ | L | N | M | $r_4$ | m | $r_5$ | $i_5$ | $f_5$ | Z | Y |
|---|---|---|---|---|---|---|---|---|---|---|---|---|---|---|
| 1 | 5¼ | 2 | 0 | 3¼ | 4 | 1 | 1 | 4 | 2 | 3¼ | 3 | ¼ | 1 | 10 |
| 6 | 10½ | 2 | 0 | 8½ | 2 | 2 | 2 | 9 | 1 | 8¼ | 8 | ¼ | 1 | 384 |
| 8 | 10½ | 2 | 1 | 7½ | 2 | 2 | 1 | 5 | 2 | 3¾ | 3 | ¾ | 2 | 15 |

We now address the question of how the 2M-dimensional subsets can illustratively be divided into inner and outer groups and, if necessary, sub-groups and perhaps, sub-sub-groups, etc., in order to transmit an input bit stream at a particular fractional bit rate of r bits per 2N-dimensional symbol. (In the following discussion, it is always assumed that $L \times N/M$ is an integral power, m, of 2, i.e., $L \times N/M = 2^m$.)

We begin by defining the following parameters:

$r_5 = r_3 \times M/N$ which is the average number of bits per 2M-dimensional signal point which are not used to identify the 2M-dimensional subsets $i_5$ is the integral portion of $r_5$ $f_5$ is the fractional portion of $r_5$, having the binary expression:

$$f_5 = d_0 2^{-m} + d_1 2^{-m+1} + d_2 2^{-m+2} + \ldots + d_{m-1} 2^{-1},\ d_i \in \{0,1\}$$

Z = number of non-zero coefficients, $d_i$'s, in the expression for $f_5$

Assume there are Y 2M-dimensional signal points in each 2M-dimensional subset, Y being determined in a manner that will be described hereinbelow. We begin by focusing on the first term of the binary expression for $f_5$, namely $d_0 2^{-m}$. (As long as L is the least integer such that $L \times r$ is an integer, then $d_0$ is always non-zero.) The Y signal points are divided into inner and outer groups (on the basis of energy) such that the ratio of the number of points in the outer group to the number of points in the inner group is $2^{-m}$. In order to eliminate (at least some of the) sequences of $2^7$ 2M-dimensional signal points that are not needed, we eliminate all sequences that have more than one point from the outer group. If $d_0$ is the only non-zero coefficient in the binary expression, the task is complete, as is the case in the embodiments of FIGS. 1 and 6.

Assume that the next term in the binary expression that has a non-zero coefficient is the term having the coefficient $d_j$ for some j. We divide the sequence of $2^m$ 2M-dimensional signal points into $2^j$ sub-sequences of $2^{m-j}$ 2M-dimensional signal points. Each of the groups (or sub-groups if this step needs to be repeated as described below) is itself further divided into inner and outer sub-groups—again based on energy. The division of each of the groups into inner and outer sub-groups is such that the ratio of the number of points in the outer sub-group to the number of points in the inner sub-group is $2^{-m+j}$. In order to eliminate more of the sequences of $2^m$ 2M-dimensional signal points that are not needed, we concentrate on each of the aforementioned sub-sequences of $2^{m-j}$ 2M-dimensional signal points individually. In particular, we eliminate all sub-sequences that have more than one point from one of the outer sub-groups of all of the groups. This step is repeated for all additional non-zero $d_i$'s.

The total number of sub-groups in each 2M-dimensional subset therefore is $2^Z$. And the number Y of signal points in each 2M-dimensional subset can therefore be determined by $$Y = 2^{i_5} \cdot \prod_{\substack{i=0 \\ d_i \neq 0}}^{m-1} (1 + 2^{-m+i}),$$

(for sufficiently large $i_5$), where $\pi$ is the multiplication symbol, by convention.

It will thus be seen that the sequence of L×N/M 2M-dimensional points that are selected are from only selected combinations of various sub-groups of the constituent 2M-dimensional constellations, with the combinations being selected, at least in part, on the basis of the average energy of the sequences of 2M-dimensional points in each combination.

The values of the parameters m, $r_5$, $i_5$, $f_5$, Z and Y for each of the three embodiments disclosed hereinabove are also shown in Table I.

The degree of advantage provided by the present invention depends somewhat on the values of the parameters involved. As a particularly dramatic example, consider the case of transmitting data at 19.2K bits/s with a 2 D trellis code using a baud rate of 2,742.86. This results in a transmission rate of 7 data bits per 2 D symbol. Adding one redundant bit, for a total of 8 bits per 2 D symbol, results in the requirement of a 256-symbol 2 D constellation. Suppose, now, that one wants to fall back to a rate of 16.8K bits/s at the same baud rate. This results in a transmission rate of 6⅛ data bits per 2 D symbol. Adding one redundant bit, for a total of 7⅛ bits per 2 D symbol, would result—following the prior art approach to the realization of this bit rate—in the requirement of a sequence of one 256-symbol 2 D constellation followed by seven 128-symbol constellations. The presence of the 128-symbol constellation in this scheme will, indeed, improve the immunity to AWGN. However, since a 256-symbol constellation is also employed in this case, the robustness of the scheme against impairments other than AWGN is not improved, which is one of the reasons for going to a fallback rate in the first instance. Indeed, the performance may be even worse than at the original rate because a larger peak-to-average power ratio results from the combined use of the two constellation sizes. As noted above, it is for this reason that the prior art favors a multi-dimensional trellis-encoded scheme which can handle a fractional bit rate, even though a much larger decoding delay is incurred.

Using the present invention, by contrast, a 144-symbol 2 D constellation can be used exclusively to provide the 16.8K bits/s fallback rate. Because the constellation is now smaller (compared to the 256-symbol constellation used at 19.2K bits/s), performance is improved not only with respect to AWGN, but also with respect to other impairments, as described earlier.

The foregoing merely illustrates the principles of the invention and various exemplary alternatives; variations and modifications will now be described.

The various constellations, bit and baud rates, and other parameters are, of course, merely illustrative. Moreover, although the invention is described herein in the context of multiple amplitude/multiple phase constellations, conventionally known as "QAM", it is equally applicable to other types of constellations, such as constant amplitude/multiple phase constellations, such as M-PSK and M-DPSK. Additionally, although the invention is described herein in the context of voiceband data transmission, it is equally applicable to such other applications as cellular mobile radio, digital microwave radio, and satellite communications.

The subsets associated with a particular group of non-trellis-encoded bits need not be subsets that are identified by the trellis encoder successively. Moreover, the bits input to the pre-encoder which ultimately (a) identify the subsets and (b) select particular points from the identified subsets need not have any particular time relationship one to the other. For example, the bits that identify the subsets need not be contiguous in the input data stream with the bits that identify the particular points from those subsets.

For pedagogic clarity, the various functional blocks shown in the illustrative embodiments are represented as discrete circuit elements. As is well known, however, the functions of those blocks may be realized, for example, via one or more appropriately programmed general-purpose processors and/or digital signal processing (DSP) chips.

It will thus be appreciated that although specific embodiments of the invention are presented herein, those skilled in the art will be able to devise numerous other arrangements which, although not explicitly shown or described herein, embody the principles of the invention and are within their spirit and scope.

I claim:

1. A method for encoding a stream of data bits to identify, from a predetermined 2N-dimensional constellation of symbols, N being a predetermined integer, a plurality of successive ones of the symbols that are to be transmitted over a communication channel at a predetermined symbol rate, the symbols of the constellation being divided into a predetermined plurality of 2N-dimensional subsets and the data bits occuring at a fractional bit rate relative to the symbol rate, the method comprising the steps of aggregating the bits occurring over a predetermined number of the symbol intervals, the predetermined number of intervals being such that an integral number of bits is aggregated, trellis encoding ones of the aggregated bits to identify, for each of the plurality of symbols, a respective subset from which that symbol is to be chosen, and choosing each of the plurality of symbols from their respective subsets jointly as a function of at least a particular group of the others of the aggregated bits.

2. The invention of claim 1 wherein the symbols in each of said 2N-dimensional subsets are divided into first and second groups and wherein said choosing step includes the step of choosing symbols from only selected combinations of said groups.

3. The invention of claim 2 wherein said symbols in each of said 2N-dimensional subsets are divided into said first and second groups on the basis of the energy thereof.

4. The invention of claim 3 wherein said combinations are selected at least on the basis of the average energy of the sequence of 2N-dimensional symbols that comprise each combination.

5. The invention of claim 2 wherein said choosing step includes the steps of generating, in response to said particular group of bits, a binary word associated with each of the identified 2N-dimensional subsets and mapping each binary word into a particular associated symbol in the associated 2N-dimensional subset, each said binary word being such that the value of the bit at a particular location within that binary word identifies the particular group to which the associated symbol belongs.

6. The invention of claim 2 wherein the symbols in each of said first and second groups are further divided into first and second sub-groups and wherein said symbol choosing step includes the step of choosing symbols from only selected combinations of the sub-groups.

7. The invention of claim 6 wherein said symbols in each of said groups are divided into said first and second sub-groups on the basis of the energy thereof.

8. The invention of claim 6 wherein said symbol identifying step includes the steps of generating, in response to said particular group of bits, a binary word associated with each of the identified 2N-dimensional subsets and mapping each binary word into a particular associated symbol in the associated 2N-dimensional subset, each said binary word being such that the value of the bit at a first particular location within that binary word identifies the particular group to which the associated symbol belongs and such that the value of the bit at a second particular location within that binary word identifies the particular sub-group to which the associated symbol belongs.

9. A method for encoding, into 2N-dimensional symbols, N being an integer, a stream of input bits occurring at a fractional bit rate of r bits per 2N-dimensional symbol relative to a predetermined symbol rate, said 2N-dimensional symbols being selected from a 2N-dimensional constellation comprised of a concatenation of N/M 2M-dimensional constellations each of which is partitioned into a plurality of 2M-dimensional subsets of signal points, the method comprising the steps of encoding first ones of the input bits to identify a sequence of 2M-dimensional subsets, and identifying signal points from successive ones of the identified 2M-dimensional subsets jointly in response to at least a particular group of the others of the input bits, said particular bit group being associated with at least L 2N-dimensional symbol intervals, L being an integer greater than unity.

10. The invention of claim 9 wherein said encoding step includes the step of trellis encoding at least said first ones of the input bits.

11. The invention of claim 10 wherein L is such that L×r is an integer.

12. The invention of claim 9 wherein the signal points in each of said 2M-dimensional subsets are divided into first and second groups and wherein in said signal point identifying step the identified points are from only selected combinations of said groups.

13. The invention of claim 12 wherein said signal points in each of said 2M-dimensional subsets are divided into said first and second groups on the basis of the energy thereof.

14. The invention of claim 13 wherein said combinations are selected at least on the basis of the average energy of the sequence of 2M-dimensional points that comprise each combination.

15. The invention of claim 12 wherein said signal point identifying step includes the steps of generating, in response to said others of said bits, a binary word associated with each of the identified 2M-dimensional subsets and mapping each binary word into a particular associated signal point in the associated 2M-dimensional subset, each said binary word being such that the value of the bit at a particular location within that binary word identifies the particular group to which the associated signal point belongs.

16. The invention of claim 12 wherein the signal points in each of said first and second groups are further divided into first and second sub-groups and wherein in said signal point identifying step the identified points are from only selected combinations of the sub-groups.

17. The invention of claim 16 wherein said signal points in each of said groups are divided into said first and second sub-groups on the basis of the energy thereof.

18. The invention of claim 16 wherein said signal point identifying step includes the steps of generating, in response to said others of said bits, a binary word associated with each of the identified 2M-dimensional subsets and mapping each binary word into a particular associated signal point in the associated 2M-dimensional subset, each said binary word being such that the value of the bit at a first particular location within that binary word identifies the particular group to which the associated signal point belongs and such that the value of the bit at a second particular location within that binary word identifies the particular sub-group to which the associated signal point belongs.

19. Apparatus for encoding a stream of data bits to identify, from a predetermined 2N-dimensional constellation of symbols, N being a predetermined integer, a plurality of successive ones of the symbols that are to be transmitted over a communication channel at a predetermined symbol rate, the symbols of the constellation being divided into a predetermined plurality of 2N-dimensional subsets and the data bits occurring at a fractional bit rate relative to the symbol rate, said apparatus comprising means for aggregating the bits occurring over a predetermined number of the symbol intervals, the predetermined number of intervals being such that an integral number of bits is aggregated, means for trellis encoding ones of the aggregated bits to identify, for each of the plurality of symbols, a respective subset from which that symbol is to be chosen, and means for choosing each of the plurality of symbols from their respective subsets jointly as a function of at least a particular group of the others of the aggregated bits.

20. The invention of claim 19 wherein the symbols in each of said 2N-dimensional subsets are divided into first and second groups and wherein said choosing means chooses symbols from only selected combinations of said groups.

21. The invention of claim 20 wherein said symbols in each of said 2N-dimensional subsets are divided into said first and second groups on the basis of the energy thereof.

22. The invention of claim 21 wherein said combinations are selected at least on the basis of the average energy of the sequence of 2N-dimensional symbols that comprise each combination.

23. The invention of claim 20 wherein said choosing means includes means for generating, in response to said particular group of bits, a binary word associated with each of the identified 2N-dimensional subsets and means for mapping each binary word into a particular associated symbol in the associated 2N-dimensional subset, each said binary word being such that the value of the bit at a particular location within that binary word identifies the particular group to which the associated symbol belongs.

24. The invention of claim 20 wherein the symbols in each of said first and second groups are further divided into first and second sub-groups and wherein said choosing means chooses symbols from only selected combinations of the sub-groups.

25. The invention of claim 24 wherein said symbols in each of said groups are divided into said first and second sub-groups on the basis of the energy thereof.

26. The invention of claim 24 wherein said symbol identifying means includes means for generating, in response to said particular group of the others of said bits, a binary word associated with each of the identified 2N-dimensional subsets and means for mapping each binary word into a particular associated symbol in the associated 2N-dimensional subset, each said binary word being such that the value of the bit at a first particular location within that binary word identifies the particular group to which the associated symbol belongs and such that the value of the bit at a second particular location within that binary word identifies the particular sub-group to which the associated symbol belongs.

27. Apparatus method for encoding, into 2N-dimensional symbols, N being an integer, a stream of input bits occurring at a fractional bit rate of r bits per 2N-dimensional symbol relative to a predetermined symbol rate, said 2N-dimensional symbols being selected from a 2N-dimensional constellation comprised of a concatenation of N/M 2M-dimensional constellations each of which is partitioned into a plurality of 2M-dimensional subsets of signal points, said apparatus comprising means for encoding first ones of the input bits to identify a sequence of 2M-dimensional subsets, and means for identifying signal points from successive ones of the identified 2M-dimensional subsets jointly in response to at least a particular group of the others of the input bits, said particular bit group being associated with at least L 2N-dimensional symbol intervals, L being an integer greater than unity.

28. The invention of claim 27 wherein said encoding means includes means for trellis encoding at least said first ones of the input bits.

29. The invention of claim 28 wherein L is such that $L \times r$ is an integer.

30. The invention of claim 27 wherein the signal points in each of said 2M-dimensional subsets are divided into first and second groups and wherein said signal point identifying means identifies points from only selected combinations of said groups.

31. The invention of claim 30 wherein said signal points in each of said 2M-dimensional subsets are divided into said first and second groups on the basis of the energy thereof.

32. The invention of claim 31 wherein said combinations are selected at least on the basis of the average energy of the sequence of 2M-dimensional points that comprise each combination.

33. The invention of claim 30 wherein said signal point identifying means includes means for generating, in response to said others of said bits, a binary word associated with each of the identified 2M-dimensional subsets and means for mapping each binary word into a particular associated signal point in the associated 2M-dimensional subset, each said binary word being such that the value of the bit at a particular location within that binary word identifies the particular group to which the associated signal point belongs.

34. The invention of claim 30 wherein the signal points in each of said first and second groups are further divided into first and second sub-groups and wherein said signal point identifying means identifies points from only selected combinations of the sub-groups.

35. The invention of claim 34 wherein said signal points in each of said groups are divided into said first and second sub-groups on the basis of the energy thereof.

36. The invention of claim 34 wherein said signal point identifying means includes means for generating, in response to said others of said bits, a binary word associated with each of the identified 2M-dimensional subsets and means for mapping each binary word into a particular associated signal point in the associated 2M-dimensional subset, each said binary word being such that the value of the bit at a first particular location within that binary word identifies the particular group to which the associated signal point belongs and such that the value of the bit at a second particular location within that binary word identifies the particular sub-group to which the associated signal point belongs.

* * * * *